(12) United States Patent
Bischur et al.

(10) Patent No.: US 10,727,764 B2
(45) Date of Patent: Jul. 28, 2020

(54) PIEZOELECTRIC GENERATOR, PUSHBUTTON, RADIO MODULE AND METHOD FOR PRODUCING A PIEZOELECTRIC GENERATOR

(71) Applicant: Guenter Beckmann, Dachau (DE)

(72) Inventors: Enrico Bischur, Munich (DE); Norbert Schwesinger, Eching (DE); Sandy Zaehringer, Dachau (DE)

(73) Assignee: Guenter Beckmann, Dachau (DE)

( * ) Notice: Subject to any disclaimer, the term of this patent is extended or adjusted under 35 U.S.C. 154(b) by 378 days.

(21) Appl. No.: 15/550,876

(22) PCT Filed: Feb. 13, 2016

(86) PCT No.: PCT/DE2016/100067
§ 371 (c)(1),
(2) Date: Aug. 14, 2017

(87) PCT Pub. No.: WO2016/127980
PCT Pub. Date: Aug. 18, 2016

(65) Prior Publication Data
US 2018/0026554 A1    Jan. 25, 2018

(30) Foreign Application Priority Data

Feb. 13, 2015   (LU) .......................................... 92655

(51) Int. Cl.
*H02N 2/18*     (2006.01)
*H01L 41/113*   (2006.01)
(Continued)

(52) U.S. Cl.
CPC ........... *H02N 2/181* (2013.01); *H01L 41/042* (2013.01); *H01L 41/0471* (2013.01);
(Continued)

(58) Field of Classification Search
CPC .................................................... H02N 2/181
See application file for complete search history.

(56) References Cited

U.S. PATENT DOCUMENTS 4,330,730 A    5/1982   Kurz et al.
9,800,178 B2   10/2017  Zhang et al.
(Continued)

FOREIGN PATENT DOCUMENTS

DE        4217351 C1      10/1993
DE    102010016499 A1     10/2011
(Continued)

OTHER PUBLICATIONS

International Search Report dated May 13, 2016 in corresponding application PCT/DE2016/100067.
(Continued)

*Primary Examiner* — Thomas M Dougherty
*Assistant Examiner* — Karen B Addison
(74) *Attorney, Agent, or Firm* — Muncy, Geissler, Olds & Lowe, P.C.

(57) ABSTRACT

A piezoelectric generator is specified, comprising a deformation body, which spans a projection surface and is embodied with a setpoint pressure surface situated opposite the projection surface, wherein the projection surface can be converted from a smaller projection surface when not loaded under pressure into a larger projection surface when pressure is applied to the setpoint pressure surface substantially perpendicular to the projection surface, and a spring effect is provided which counteracts an application of pressure to the setpoint pressure surface, wherein an electromechanical transducer element comprising a piezoelectric material wholly or partly spans the projection surface, such that the transducer element is embodied in an expandable fashion upon pressure being applied to the deformation body, and
(Continued)

electrical microenergy can be generated by means of the piezoelectric material.

20 Claims, 3 Drawing Sheets

(51) Int. Cl.
  *H01L 41/193* (2006.01)
  *H01L 41/25* (2013.01)
  *H02N 2/00* (2006.01)
  *H01L 41/04* (2006.01)
  *H01L 41/047* (2006.01)
  *H01L 41/053* (2006.01)
  *H01L 41/083* (2006.01)

(52) U.S. Cl.
  CPC ...... *H01L 41/0536* (2013.01); *H01L 41/0831* (2013.01); *H01L 41/113* (2013.01); *H01L 41/193* (2013.01); *H01L 41/25* (2013.01); *H02N 2/18* (2013.01); *H02N 2/22* (2013.01)

(56) References Cited

U.S. PATENT DOCUMENTS

| | | | |
|---|---|---|---|
| 2001/0035723 A1* | 11/2001 | Pelrine | F02G 1/043 318/116 |
| 2004/0113526 A1* | 6/2004 | Kirjavainen | B06B 1/0292 310/328 |
| 2005/0162042 A1* | 7/2005 | Krill | H02N 2/10 310/328 |
| 2008/0203850 A1* | 8/2008 | Martineau | H02N 2/18 310/309 |
| 2009/0216292 A1 | 8/2009 | Pless et al. | |
| 2012/0228992 A1 | 9/2012 | Skotnicki | |

FOREIGN PATENT DOCUMENTS

| | | |
|---|---|---|
| DE | 202013101796 U1 | 7/2014 |
| JP | 2014-239647 A | 12/2014 |
| WO | WO 03/038969 A2 | 5/2003 |
| WO | WO2014110848 A1 | 7/2014 |

OTHER PUBLICATIONS

International Search Report dated May 23, 2016 in corresponding application PCT/DE2016/100068.

* cited by examiner

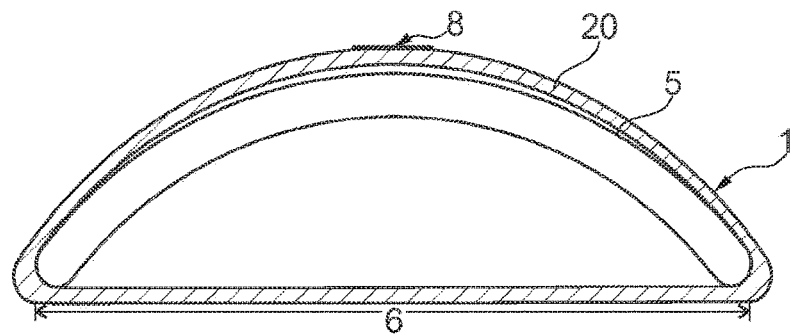
Fig. 7a
Fig. 7b
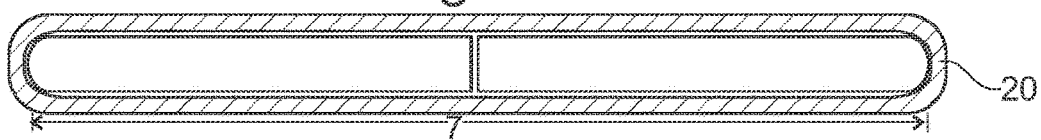
Fig. 8a
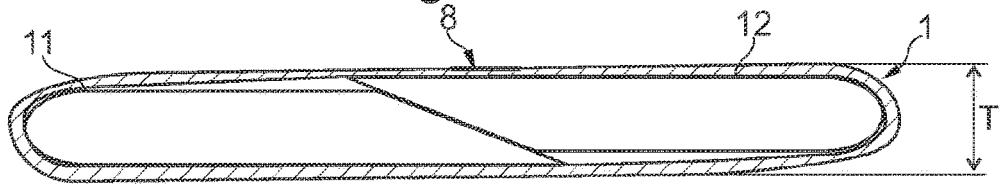
Fig. 8b
Fig. 9a
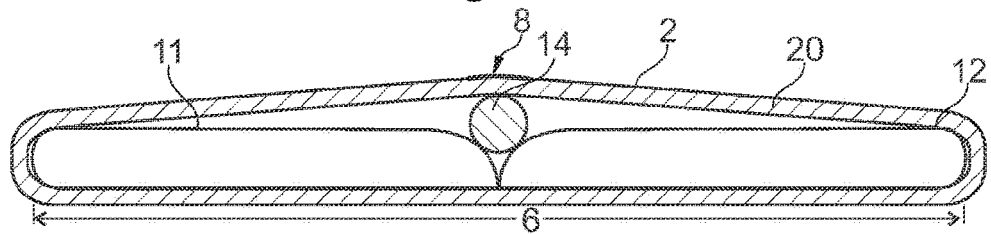
Fig. 9b
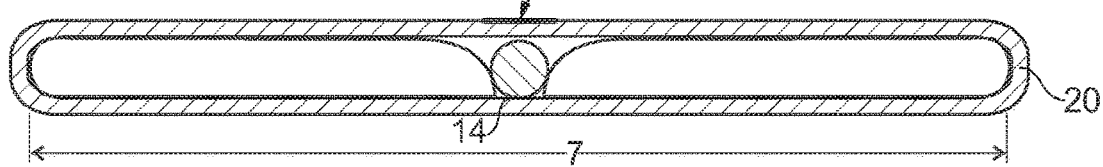
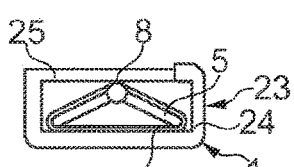
Fig. 10
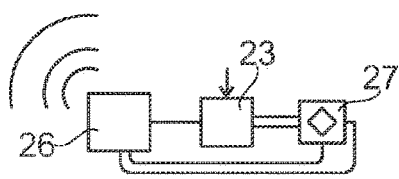
Fig. 11

PIEZOELECTRIC GENERATOR, PUSHBUTTON, RADIO MODULE AND METHOD FOR PRODUCING A PIEZOELECTRIC GENERATOR

TECHNICAL FIELD

The invention relates to a piezoelectric generator, as well as to a pushbutton, a radio module, and a method for producing a piezoelectric generator.

BACKGROUND ART

It is known to produce piezoelectric generators as energy conversion modules in order to convert mechanical, kinetic energy into electrical energy. DE 10 2010 016 499 A1 describes planar piezoelectric generator modules and a method for the production thereof. Wound and then flattened piezoelectric generators convert mechanical energy into electrical energy.

One of the most efficient materials for the piezoelectric effect is a lead-zirconate-titanate (PZT) ceramic. An overload-protected piezoelectric generator with a solid-state conversion element for coupling and converting deformation energy is known. A piezoceramic is connected to an elastic transducer element. The deformation element is deformed by an acting deformation energy, which causes a deformation of the piezoceramic. The deformation of the piezoceramic occurs like a bending beam structure.

A solution which converts an acting compressive force perpendicular to the surface of a piezoelectric material into a tensile force is known. To implement a force, two caps are used in the form of a cymbal so that tensile forces act on a piezoelectric material and vibrational energy is harvested. The cymbal caps are applied to a piezoelectric crystal at the top and bottom. By pressing the two cymbal caps together from above and below, the piezoelectric crystal is stretched transversely thereto.

A system is known for converting electrical energy from mechanical energy, wherein a plurality of arranged cymbals placed horizontally in a mirror image to one another can be compressed between two parallel plates when a person walks on a floor with a system lying below.

The generators described above are designed for the use of piezoceramics.

DESCRIPTION OF THE INVENTION

It is an object of the present invention to provide a device and a manufacturing method for increasing the efficiency for converting mechanical, kinetic energy into electrical energy.

The object is achieved according to the invention by the subject of claims 1, 17, 18, 19, and 20. Advantageous refinements emerge from the dependent claims.

A concept of the invention is to increase the efficiency by structural modifications of the piezoelectric generator. A structural measure is to enlarge an electromechanical transducer element above a projection surface which spans a deformation body of the piezoelectric generator and is formed with a target pressure surface situated opposite the projection surface, namely, to surround the deformation body partly or completely at least beyond the projection surface of the deformation body. Thus, the transducer element is subjected to an expansion, in particular a rather great expansion, which passes on this greater expansion to a piezoelectric material, so that a higher electrical energy can be produced with a higher efficiency.

The piezoelectric generator is formed with a deformation body, which spans a projection surface, and with a target pressure surface situated opposite the projection surface, wherein the projection surface can be converted from a smaller projection surface, when not loaded under pressure, into a larger projection surface when pressure is applied to the target pressure surface substantially perpendicular to the projection surface, and a spring effect is provided which counteracts an application of pressure to the target pressure surface, wherein an electromechanical transducer element comprising a piezoelectric material wholly or partly overspans the projection surface, such that the transducer element is embodied in an expandable fashion upon pressure being applied to the deformation body, and electrical microenergy can be generated by means of the piezoelectric material.

In order to achieve a high energy yield, the deformation body is made elongated and in the shape of a saddle roof when viewed in profile, and in particular is made of a hard plastic. A longitudinal profile shape is simple to produce and leads to a stable manufacturability of the piezoelectric generator as a total product. A hard plastic effectively and efficiently converts the vertically acting pressure into a horizontal pressure on the piezoelectric material.

So that a maximum expansion of the electromechanical transducer element is realized, the electromechanical transducer element is preferably wound around the deformation body as a sleeve. A piezomaterial rather large in terms of area can be used, which extends around the entire sleeve.

According to an important concept of the invention, the transducer element with piezoelectric material is formed partly or, in particular, completely with a planar polymer piezoelectric generator film, in particular made of polyvinylidene difluoride (PVDF). A planar polymer piezoelectric generator film has the advantage that the service life is significantly prolonged compared with a ceramic and, in particular, a risk of breakage is significantly reduced. In addition, a significantly higher efficiency is produced when the piezoelectric generator film is expanded than in the case of a pressure load.

In order to achieve a higher efficiency, i.e., to generate more electrical energy for "energy harvesting," the piezoelectric generator film is preferably formed as a double layer, in particular multi-layered.

According to one embodiment refining the invention, the piezoelectric generator film is additionally or alternatively formed wound in a meander-shaped manner, wherein a first electrode is connected to a first side in an electrically conductive manner and a second electrode to a second side. The advantages in this regard are that a longer piezoelectric generator film is used, which in turn leads to an increase in the efficiency of the generated electrical energy.

According to one embodiment refining the invention, the deformation body comprises legs which are arranged at an angle and are formed connected at least to one flexible angle section, so that the legs can be pivoted apart at least at the angle section upon application of pressure and in particular at least the angle section of the deformation body is made of a material having a modulus of elasticity by means of which a spring action can be produced in the deformation body. Thus, by means of a deformation body with a fairly simple design, a compressive force acting on a surface, i.e., on a target pressure surface, is transformed into a tensile force, which acts efficiently as a tensile force on planar generators incorporated into a polymer film. Thus, the piezoelectric film of the piezoelectric generator is stretched, for example, as a sleeve in the winding direction. The deformation body in this case is arranged in the interior of the film angle. The projection surface, which is formed by the leg of the deformation body, is thus enlarged when pressure is applied; this leads to an expansion of the film winding, spanned thereabove, of the polymer piezoelectric generator film and thus generates electrical energy.

According to a further preferred embodiment, the deformation body is designed in multiple parts. This has the advantage that each section as a component of the deformation body has a specific function and, accordingly, each component is optimized in terms of material and optimized in terms of construction.

According to one embodiment refining the invention, the deformation body comprises at least one angle hinge with two legs, wherein the angle hinge comprises a spring. By means of the spring, the deformation body can be moved back into a basic setting with a defined angle opposite to a pressure-applying force.

According to a further preferred embodiment, in order to achieve a maximally large projection area upon pressure application, the angle hinge is formed with a maximum depth (T), which corresponds to a thickness (S) of the particular two legs, when viewed in cross section.

According to an alternative preferred embodiment, the angle hinge is formed with a depth (T) that is greater than the thickness (S) of the particular two legs, when viewed in cross section. This has the advantage that an overspanning is reduced; i.e., a buckling of the legs 180° C. in the opposite direction is avoided.

In order to produce an advantageous mechanism for a pushbutton in a housing according to a preferred embodiment, the length of a first leg is made longer than that of the complementary second leg according to a preferred embodiment.

According to an alternative embodiment, the deformation body, when viewed in cross section, is formed with a plurality of adjacently arranged angles in a concertina-like fashion, so that the projection surface upon pressure application extends from a first pair of legs to an opposite end of a last pair of legs. The advantage in this case is that a minimal change in height produces a maximum expansion and thus a maximum energy yield.

According to an alternative embodiment, the deformation body, when viewed in cross section, is formed with an arcuate structure, wherein the legs are spanned by the transducer element with piezoelectric material, or a sleeve surrounds the deformation body. It is understood that the spring action of the deformation body, as described above, is realized due to a modulus of elasticity of the material of the deformation body or alternatively is formed as a separate spring element.

According to an alternative embodiment, the deformation body is formed as two parts with a sliding structure that connects both parts, wherein, when viewed in profile, two opposite ends of the two parts each have a wedge shape, each of which rests engaging in one another as an oblique plane relative to one another, so that in a compressed state the parts are pushed together with a minimum projection surface, overlapping with the contact tips when viewed in cross section, and in an expanded state can be arranged with maximum contact and maximally pushed apart.

According to an alternative embodiment refining the invention, the deformation body is formed in three parts, wherein a central part, in particular a cylinder when viewed in cross section, is arranged centrally and two planar parts are arranged on both sides to the cylinder, wherein the planar parts have inclined surfaces on which the third part is slidable.

The invention thus provides a piezoelectric generator with a deformation body which spans a projection surface with respect to pressure application and is formed with a target pressure surface situated opposite the projection surface, wherein the projection surface can be converted from a smaller projection surface, when not loaded under pressure, into a larger projection surface when pressure is applied to the target pressure surface substantially perpendicular to the projection surface, and the deformation body has a spring action which counteracts a pressure application to the target pressure surface, wherein a piezoelectric generator film with piezoelectric material with two electrode ends as an electromechanical transducer element spans the projection surface and is wound multiple times around the deformation body as a sleeve, so that the piezoelectric generator film is embodied in an expandable fashion upon pressure being applied to the deformation body. Thus, a piezoelectric generator is produced which achieves the service life during use, for example, of a pushbutton and provides it sufficiently with electrical energy.

The invention is achieved by a pushbutton with an above-described piezoelectric generator in that it is formed with a housing in which the piezoelectric generator is placed and a button element with which the target pressure surface of the deformation body can be acted upon mechanically by pressure. Thus, electrical energy necessary for signal transmission is generated in the form of a box module. A battery and its replacement after energy consumption are thus no longer necessary.

The invention is also achieved by a radio module with an above-described mechanical button which comprises a piezoelectric generator as described above and has a radio unit with a control electronics unit, a rectifier unit, and optionally an energy storage unit. The rectifier unit, as well as a radio unit and control electronics unit, can be implemented in the piezoelectric generator or printed on the piezoelectric film. Key signals can be transmitted, for example, within a room by the radio module. A radio module as a sensor with a mechanical button has the advantage that a high, disadvantageous cabling effort is eliminated, thereby sparing resources. In addition, the button can be used as a mobile sensor in the room and can be used in a variety of applications. So that the radio module operates reliably for several years without a renewal of an energy storage unit as well, the piezoelectric generator is built into the radio module.

The invention is also achieved by a method for producing a piezoelectric generator, wherein a polymer piezoelectric generator film as a transducer element with piezoelectric material is wound around a deformation body with spring action to form a sleeve, wherein the deformation body spans a projection surface with respect to a target pressure surface and is formed with a target pressure surface situated opposite the projection surface, wherein the projection surface can be converted from a smaller projection surface, when not loaded under pressure, into a larger projection surface when pressure is applied to the target pressure surface substantially perpendicular to the projection surface. Thus, an efficient piezoelectric generator is produced, which is unbreakable and the service life of which is assured application-specific.

The invention is also achieved by a method for generating electrical energy by means of an above-described piezoelectric generator, wherein the piezoelectric generator is formed with a deformation body.

BRIEF DESCRIPTION OF THE DRAWINGS

Further advantages, details, and refinements of the invention are explained in the following description with reference to drawings. In the drawing:

FIGS. 7a, 7b show a sixth preferred embodiment of a piezoelectric generator in the relaxed and loaded state;

FIGS. 8a, 8b show a seventh preferred embodiment of a piezoelectric generator in the relaxed and loaded state;

FIGS. 9a, 9b show a preferred eighth embodiment of a piezoelectric generator in the relaxed and loaded state;

FIG. 10 shows a pushbutton of the invention; and

FIG. 11 shows a radio module of the invention.

BEST MODE FOR CARRYING OUT THE INVENTION

Figure 1:
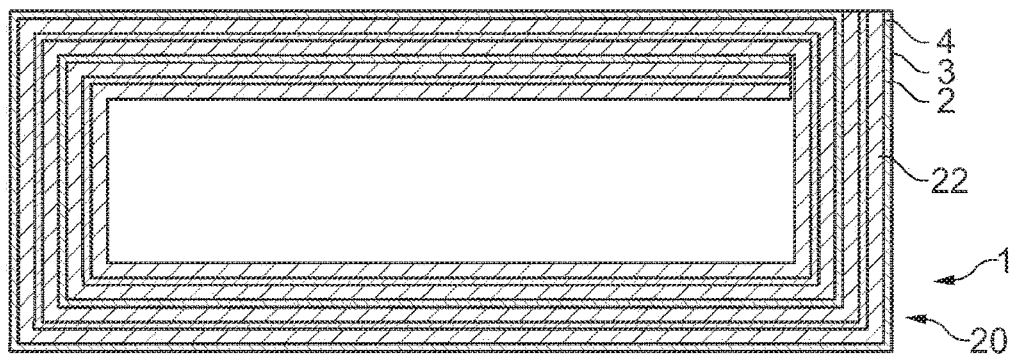
FIG. 1 is a cross-sectional view of a wound polymer piezoelectric generator film without a deformation body.

FIG. 1 shows, viewed in cross section, a piezoelectric generator 1 of the invention, without a deformation body 5. FIG. 1 shows, in an enlarged detail, in an abstract manner, a film body wound to form a sleeve 20, or also called a film winding, which preferably has a piezoelectric polymer film 2, as it is described in DE 10 2010 016 499 A1. In contrast to the description of the first embodiment of DE 10 2010 016 499 A1, piezoelectric film 2 is not folded in a meander-shaped fashion, but is wound in a double layer above one another to form two piezoelectric films according to the second embodiment. Both embodiments described there are possible for realizing the present invention. It is possible to wind a film 2, folded in a meander-shaped manner, as a sleeve 20, as shown in FIG. 1, or to wind a single- or double- or multi-layered piezoelectric film 2, 22. Piezoelectric film 2 as a transducer element is preferably made of polyvinylidene difluoride (PVDF). Each side of piezoelectric film 2, 22 forms a film-like electrode 3, 4. At least one insulator layer is arranged between the individual electrode layers. Piezoelectric film 2 is preferably coated metallically. The production process is carried out either by gas phase passivation or by a sputtering process. The two electrodes 3, 4 are preferably produced from the same material and can be produced more preferably in a common process step. The thickness of the piezoelectric films 2, 22 is between 10 μm and 50 μm. Piezoelectric film 2 is very cost-intensive and therefore requires efficient handling to produce piezoelectric generator 1. Piezoelectric film 2 is wound with such a length that it generates the energy required for the application with a sufficient reliability in a loaded state, i.e., upon expansion. The maximum expansion is designed such that it is below a breaking or tearing limit.

Figure 2A:
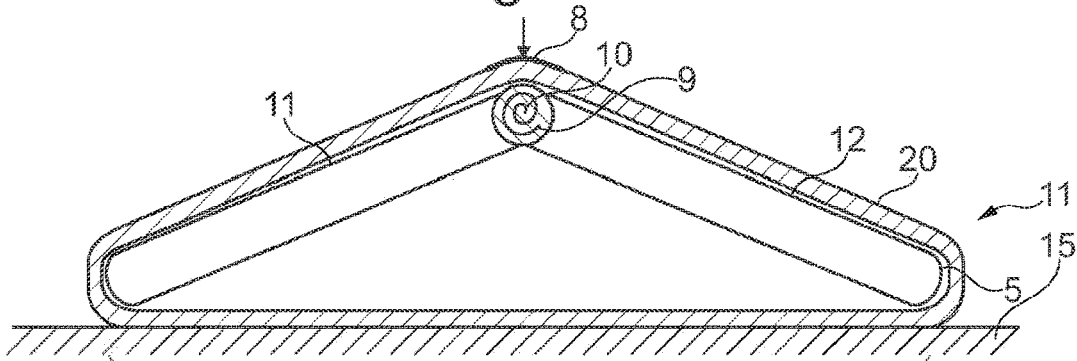
FIGS. 2a, 2b, viewed in cross section, show the piezoelectric generator with a deformation body with a hinge and two equally long legs in the relaxed and loaded state.
Figure 2B:
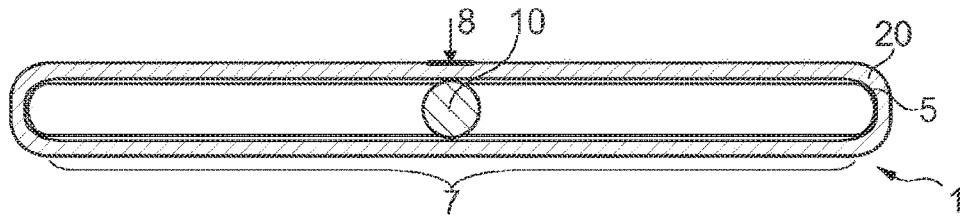

FIG. 2a shows a piezoelectric generator 1 with a deformation body 5 of the invention made of hard plastic, around which a piezoelectric film 2 described for FIG. 1 is wound as a film winding and sleeve 20. For the purpose of simplification, first electrode 3 and second electrode 4, as well as the precise structure of sleeve 20 are omitted in FIGS. 2, 3, 4, 5, 6, 7, 8, and 9. FIG. 2a shows piezoelectric generator 1 in an unloaded state. Piezoelectric generator 1, with deformation body 5, spans a projection surface 6 which exerts a pressure against an abstracted illustrated bottom surface 15 when a pressure is applied to an oppositely situated target pressure surface 8. FIG. 2b shows a maximum loaded state, in which projection surface 6 is converted and expanded to a projection surface 7. Deformation body 5 according to FIGS. 2a and 2b has two legs 11, 12 and is connected by means of a hinge 10. A spring 9, which holds deformation body 5 in a relaxed state according to FIG. 2a and returns it to this state when pressure is applied, is integrated into the hinge. Deformation body 5 is thus constructed in three parts with two legs 11, 12 and an angle hinge 10.

Figure 3A:
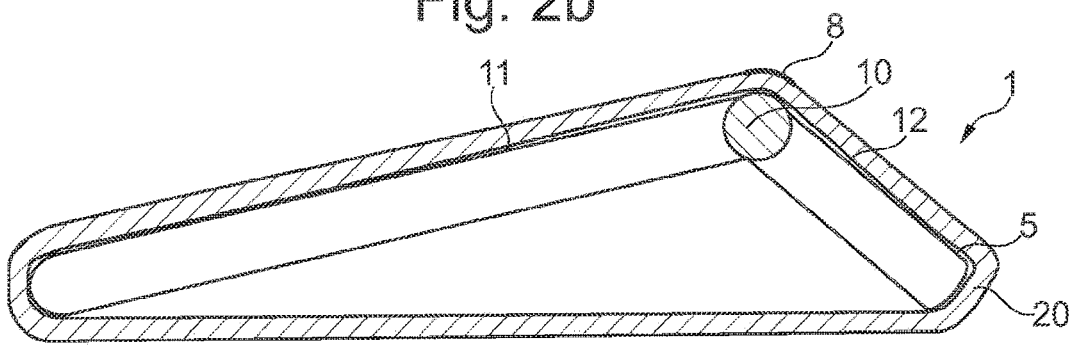
FIGS. 3a, 3b show an alternative second embodiment of a piezoelectric generator according to FIG. 2 in the relaxed and loaded state.
Figure 3B:

FIGS. 3a and 3b show piezoelectric generator 1 according to FIGS. 2a and 2b, viewed in cross section, with the difference that in this second particularly preferred embodiment, leg 11 of deformation body 5 is clearly longer than leg 12 when viewed in cross section. This embodiment affords advantages in the mechanics of a pushbutton 23 when an overlying button element 25 is rotatably mounted, for example, on the leg end of leg 11, as is described and illustrated below with reference to FIG. 10.

Figure 4A:
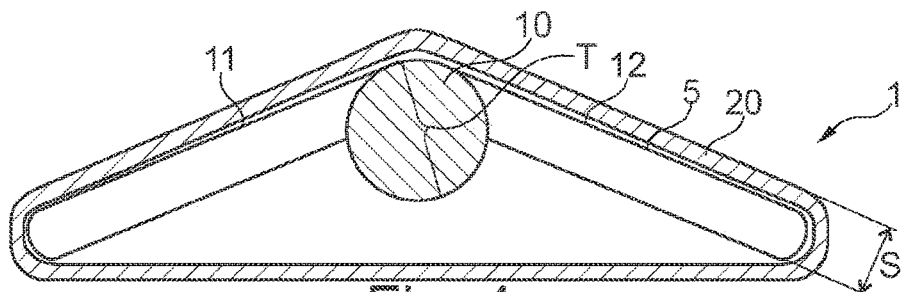
FIGS. 4a, 4b show a further third preferred embodiment of a piezoelectric generator in the relaxed and loaded state.
Figure 4B:
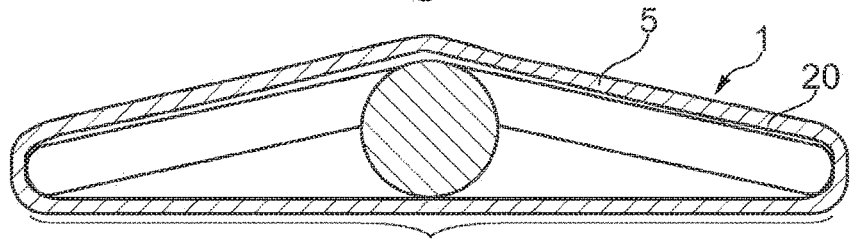

FIGS. 4a and 4b show a third preferred embodiment, wherein deformation body 5 is again formed with equally long legs 11, 12, but hinge 10 has a maximum depth (T) which is clearly formed larger than the thickness (S) of the two legs 11, 12. In FIGS. 4a and 4b, the depth (T) of hinge 10 is shown approximately twice as large as the leg thickness (S) of legs 11, 12.

As shown in FIG. 4b, this embodiment has the advantage that the overspanning of deformation body 5 during the conversion to projection surface 7 is prevented in the maximum loaded state. Deformation body 5 can be expanded by a defined, smaller depth than shown in FIG. 2. This is usually sufficient because very small movements or expansions are sufficient to generate the maximum electrical energy in piezoelectric generator 1.

Figure 5A:
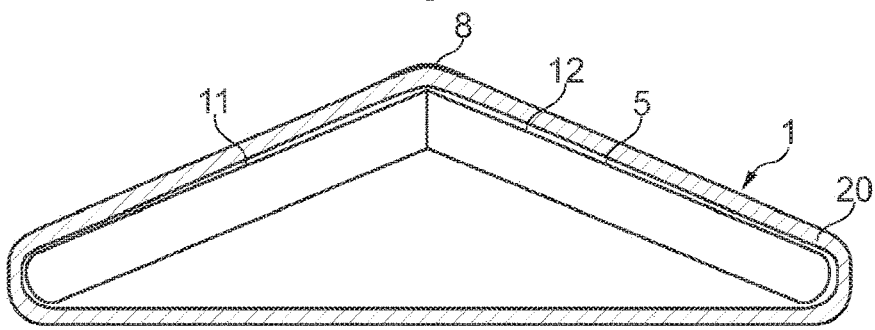
FIGS. 5a, 5b show a fourth preferred embodiment of a piezoelectric generator in the relaxed and loaded state.
Figure 5B:
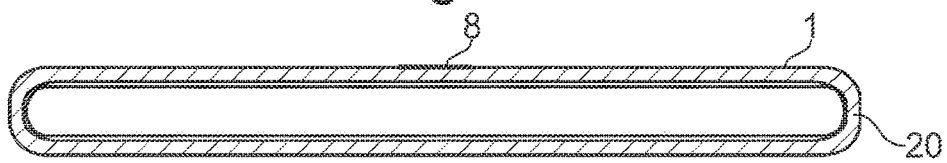

FIGS. 5a and 5b show piezoelectric generator 1 in a fourth particularly preferred embodiment. In this fourth embodiment, deformation body 5 is formed without a separate hinge 10. Legs 11 and 12 are made of a uniform elastic material. The material has a correspondingly designed modulus of elasticity in order to produce a spring action between a relaxed state as shown in FIG. 5a and a loaded state under a load on target pressure surface 8 according to FIG. 5b. Deformation body 5 is thus produced as a single piece.

Figure 6A:
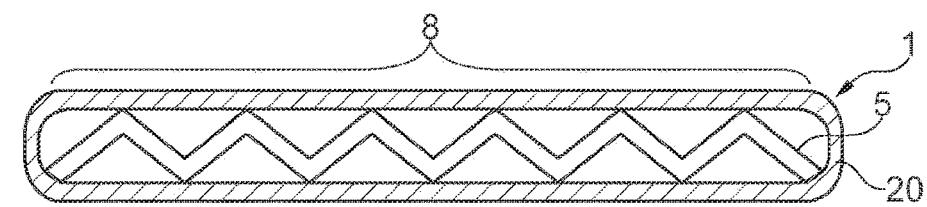
FIGS. 6a, 6b show a fifth preferred embodiment of a piezoelectric generator in the relaxed and loaded state.
Figure 6B:

FIG. 6 shows piezoelectric generator 1 of the invention, viewed in cross section, in a fifth preferred embodiment, in which the six pairs of legs, when viewed in cross section, are arranged in a row and, being made of a uniform material, form deformation body 5. In this embodiment, target pressure surface 8 is formed almost over the entire cross-sectional length of piezoelectric generator 1. A structure of this kind is suitable, for example, in flat applications in order to produce a maximum expansion with the smallest possible stroke.

FIGS. 7a and 7b show a sixth particularly preferred embodiment of a piezoelectric generator 1 with an arcuate deformation body 5. Piezoelectric film 2 is wound around arcuate deformation body 5 to form sleeve 20 and spans both the leg ends as shorter chords in the relaxed state of arcuate deformation body 5 and therefore also the half arc. FIG. 7b shows deformation body 5 in a loaded state with a maximum projection surface 7 compared with the reduced projection surface 6 from FIG. 7a.

FIGS. 8a and 8b show a seventh particularly preferred embodiment of a piezoelectric generator 1, viewed in cross section. In this embodiment, deformation body 5 is formed in two parts, the two parts overlapping by means of an oblique plane when the center is relaxed. Sleeve 20 of piezoelectric film 2 is wound such that legs 11, 12 are pushed over one another in an overlapping manner and produce a greater depth (T) than their leg thickness (S). The spring path now consists of pressure application to the centrally formed target pressure surface 8 against a bottom surface 15 so as to produce an expansion of sleeve 20 of piezoelectric generator 1, such that the depth (T) reduces to the leg thickness (S) at the oblique plane and the two legs are no longer arranged overlapping when viewed in cross section, but are pushed uniformly against one another. A spring action can be produced due to the expanded material of sleeve 20 or a separate spring that is not shown.

FIGS. 9a and 9b show an eighth particularly preferred embodiment of a piezoelectric generator 1 with a three-part deformation body 5; in this case, legs 11 and 12 are formed separately and have a circular rounded-off central surface, when viewed in cross section, on the mutually contacting edges, so that a cylinder 14 can be pushed therebetween in the center from the top in the loaded state when pressure is applied to central target pressure surface 8 lying above, so that sleeve 20 of piezoelectric film 2 enlarges deformation body 5 to the maximum loaded projection surface 7 compared with a relaxed state of projection surface 6, as shown in FIG. 9a. In the relaxed state, cylinder 14 therefore lies centrally in each case on legs 11, 12 in a rounded depression and only touches sleeve 20 of piezoelectric film 2 at the top. In the loaded state, upon pressure on the outer side of target pressure surface 8, cylinder 14 can also touch the oppositely situated bottom surface 24 of sleeve 20 of piezoelectric film 2 at the bottom.

FIG. 10 shows, in an abstracted manner, a pushbutton 23 of the invention with a piezoelectric generator 1, as it has been described above, which is installed in a housing 24 and accommodated therein, wherein a button element 25 is arranged in a pivotable manner above piezoelectric generator 1, so that a pressure application to deformation body 5 can be realized with button element 25 on target pressure surface 8 of piezoelectric generator 1. In so doing, the desired electrical microenergy is released and generated.

FIG. 11 shows a radio module with a previously described button 23 with a radio unit 26 and a rectifier unit 27. When mechanical pressure is applied to mechanical button 23, an alternating current is generated; said current is converted to a direct current via a rectifier unit 27, so that this direct current supplies a radio unit 26 with sufficient electrical energy to transmit corresponding signals to a receiver. Otherwise, the electrical energy is stored in a capacitor. The advantage of a radio module is that use of material for cabling and the cabling effort are eliminated. In addition, a radio module can be used in environments where electrical cable routing is difficult or unsuitable or undesirable, such as, for example, in stationary or mobile applications.

Although exemplary embodiments were explained in the preceding description, it should be pointed out that a large number of modifications are possible. In addition, it should be pointed out that the exemplary embodiments are merely examples that should not restrict the scope of protection, applications, and the structure in any way. Rather, a guide for the implementation of at least one exemplary embodiment is provided to the skilled artisan by the foregoing description, whereby various changes can be made, in particular with regard to the function and arrangement of the described components, without leaving the scope of protection as it emerges from the claims and these equivalent feature combinations.

The invention claimed is:

1. piezoelectric generator (1) comprising a deformation body (5), which spans a projection surface and is embodied with a target pressure surface (8) situated opposite the projection surface, wherein the projection surface can be converted from a smaller projection surface (6), when not loaded under pressure, into a larger projection surface (7) when pressure is applied to the target pressure surface (8) substantially perpendicular to the projection surface (6), and a spring effect is provided which counteracts an application of pressure to the target pressure surface (8), wherein an electromechanical transducer element comprising a piezoelectric material wholly or partly overspans the projection surface (6), such that the transducer element is embodied in an expandable fashion upon pressure being applied to the deformation body (5), and electrical microenergy can be generated by means of the piezoelectric material, wherein the transducer element with the piezoelectric material with a planar polymer piezoelectric generator film (2) is designed to surround the deformation body (5) beyond the projection surface (6) of the deformation body (5).

2. The piezoelectric generator (1) according to claim 1, characterized in that the deformation body (5) is made elongated and in the shape of a saddle roof when viewed in profile, and in particular is made of a hard plastic.

3. The piezoelectric generator (1) according to claim 1, characterized in that the electromechanical transducer element is wound as a sleeve (20) around the deformation body (5).

4. The piezoelectric generator (1) according to claim 1, characterized in that the planar polymer piezoelectric generator film (2) is made of polyvinylidene difluoride (PVDF).

5. The piezoelectric generator (1) according to claim 4, characterized in that the piezoelectric generator film (2) is formed as a double layer, in particular multi-layered.

6. The piezoelectric generator (1) according to claim 4, characterized in that the piezoelectric generator film (22) is formed wound in a meander-shaped manner, wherein a first electrode (3) is connected to a first side in an electrically conductive manner and a second electrode (4) to a second side.

7. The piezoelectric generator (1) according to claim 1, characterized in that the deformation body (5) comprises legs (11, 12) which are arranged at an angle and are formed connected to at least one flexible angle section, so that the legs (11, 12) can be pressed apart at least at the angle section upon application of pressure and in particular and at least the angle section of the deformation body (5) is made of a material having a modulus of elasticity by means of which the spring action of the deformation body (5) can be produced.

8. The piezoelectric generator (1) according to claim 1, characterized in that the deformation body (5) is designed in multiple parts.

9. The piezoelectric generator (1) according to claim 1, characterized in that the deformation body (5) has at least one angle hinge (10) with two legs, wherein in particular the angle hinge (10) comprises a spring.

10. The piezoelectric generator (1) according to claim 9, characterized in that the angle hinge (10) is formed with a maximum depth (T), which corresponds to a thickness (S) of the particular two legs (11, 12) when viewed in cross section.

11. The piezoelectric generator (1) according to claim 9, characterized in that the angle hinge (10) is formed with a depth (T) that is greater than the thickness (S) of the particular two legs (11, 12) when viewed in cross section.

12. The piezoelectric generator (1) according to claim 1, characterized in that the length of a first leg (11, 12) is made longer than that of the complementary second leg (11, 12).

13. The piezoelectric generator (1) according to claim 1, characterized in that the deformation body (5), when viewed in cross section, is made planar with a plurality of adjacently arranged angles in a concertina-like fashion and the projection surface (6) extends from one leg to the opposite last leg.

14. The piezoelectric generator (1) according to claim 1, characterized in that the deformation body (5), when viewed in cross section, is formed with an arcuate structure.

15. The piezoelectric generator (1) according to claim 1, characterized in that the deformation body (5) is formed as two parts with a sliding structure that connects both parts, wherein, when viewed in profile, two ends of the two parts each have a wedge shape (11A, 12A), each of which rests complementary to one another as an oblique plane, so that in a compressed state the parts are pushed together, overlapping with the contact tips, when viewed in cross section, and in an expanded state can be formed with maximum contact and maximally pushed apart.

16. The piezoelectric generator (1) according to claim 1, characterized in that the deformation body (5) is formed in three parts, wherein a central part, in particular a cylinder (14) when viewed in cross section, is arranged centrally and two planar parts are arranged on both sides to the cylinder, wherein the planar parts have inclined surfaces on which the third part can roll.

17. A pushbutton (23) with a piezoelectric generator (1) according to claim 1, with a housing (24) in which the piezoelectric generator (1) is placed and a button element (25), with which the target pressure surface (8) of the deformation body (5) can be acted upon mechanically by pressure.

18. A radio module with a mechanical pushbutton (23) according to claim 1, which comprises a piezoelectric generator (1) according to one of the preceding claims, a radio unit (26) with a control electronics unit, a rectifier unit, (27) and an energy storage unit.

19. A method for producing a piezoelectric generator (1), in particular according to claim 1, wherein a polymer piezoelectric generator film (2) as the transducer element with piezoelectric material is wound around a deformation body (5) with spring action to form a sleeve (20), wherein the deformation body (5) spans a projection surface and is formed with a target pressure surface (8) situated opposite the projection surface (6), wherein the projection surface can be converted from a smaller projection surface (6), when not loaded under pressure, into a larger projection surface (7) when pressure is applied to the target pressure surface (8) substantially perpendicular to the projection surface.

20. The method for generating electrical energy by means of a piezoelectric generator according to claim 1, wherein the piezoelectric generator (1) is formed with a deformation body (5), which spans a projection surface and is embodied with a target pressure surface (8) situated opposite the projection surface, wherein the projection surface can be converted from a smaller projection surface (6), when not loaded under pressure, into a larger projection surface (7) when pressure is applied to the target pressure surface (8) substantially perpendicular to the projection surface (6), and a spring effect is provided which counteracts an application of pressure to the target pressure surface (8), wherein an electromechanical transducer element comprising a piezoelectric material wholly or partly overspans the projection surface, such that the transducer element is embodied in an expandable fashion upon pressure being applied to the deformation body (5), and electrical microenergy can be generated by means of the piezoelectric material, wherein the transducer element with piezoelectric material is formed completely or partly with a planar polymer piezoelectric generator film (2).

* * * * *